US010374628B2

(12) United States Patent
Abali et al.

(10) Patent No.: US 10,374,628 B2
(45) Date of Patent: Aug. 6, 2019

(54) IN-PLACE DATA COMPRESSION WITH SMALL WORKING MEMORY

(71) Applicant: International Business Machines Corporation, Armonk, NY (US)

(72) Inventors: Bulent Abali, Tenafly, NJ (US); Bartholomew Blaner, Shelburne, VT (US); Paul G. Crumley, Yorktown Heights, NY (US); Hubertus Franke, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 297 days.

(21) Appl. No.: 15/480,302

(22) Filed: Apr. 5, 2017

(65) Prior Publication Data
US 2018/0293028 A1 Oct. 11, 2018

(51) Int. Cl.
*G06F 3/06* (2006.01)
*G06F 13/16* (2006.01)
*G11C 7/10* (2006.01)
*H03M 7/30* (2006.01)

(52) U.S. Cl.
CPC ............ *H03M 7/30* (2013.01); *G06F 3/064* (2013.01); *G06F 3/0604* (2013.01); *G06F 3/0605* (2013.01); *G06F 3/0679* (2013.01); *G06F 13/1694* (2013.01); *G11C 7/10* (2013.01); *H03M 7/3091* (2013.01)

(58) Field of Classification Search
CPC .... G06F 3/0604; G06F 3/0679; G06F 3/0605; G06F 3/064; G06F 13/1694; G11C 7/10; H03M 7/30; H03M 7/3091
See application file for complete search history.

(56) References Cited

U.S. PATENT DOCUMENTS

| 5,841,953 A | 11/1998 | Rohatgi | |
|---|---|---|---|
| 6,348,881 B1 * | 2/2002 | Buer | H03M 7/3084 341/106 |
| 6,766,407 B1 * | 7/2004 | Lisitsa | H04L 29/06027 709/241 |
| 7,058,783 B2 * | 6/2006 | Chandrasekaran | G06F 3/0608 711/171 |

(Continued)

OTHER PUBLICATIONS

Anonymous. A Filesystem for Linear Tape with Overwrite Segments. [online] Apr. 10, 2012. Retrieved from the Internet: http://ip.com/IPCOM/000216618D, 10 pages.

(Continued)

*Primary Examiner* — Christopher D Birkhimer
(74) *Attorney, Agent, or Firm* — Intelletek Law Group, PLLC; Gabriel Daniel, Esq.

(57) ABSTRACT

Method and apparatus for performing in-place compression is provided. The in-place compression system transfers source data from a partition of a memory to a data buffer based on a read address. Compressed data is created by referencing the source data stored in the data buffer. The system writes the compressed data to the memory partition based on a write address. When the write address points at an address location that stores source data that has not been transferred to the data buffer, the system overwrites the compressed data stored in the memory partition with the source data stored in the data buffer.

20 Claims, 9 Drawing Sheets

(56) References Cited

U.S. PATENT DOCUMENTS

| | | | | |
|---|---|---|---|---|
| 7,073,011 | B2* | 7/2006 | Lisitsa | H04L 29/06027 709/241 |
| 7,079,051 | B2 | 7/2006 | Storer et al. | |
| 7,222,182 | B2* | 5/2007 | Lisitsa | G06F 8/45 709/231 |
| 7,343,477 | B1* | 3/2008 | Thatipelli | G06F 9/3826 712/218 |
| 7,451,290 | B2* | 11/2008 | Chandrasekaran | G06F 3/0608 711/171 |
| 7,496,677 | B2* | 2/2009 | Lisitsa | G06F 8/45 709/223 |
| 7,680,992 | B1* | 3/2010 | Van Dyke | G06F 12/1425 711/155 |
| 8,117,329 | B2* | 2/2012 | Lisitsa | G06F 8/45 709/200 |
| 2004/0054858 | A1* | 3/2004 | Chandrasekaran | G06F 3/0608 711/154 |
| 2004/0221040 | A1* | 11/2004 | Lisitsa | G06F 8/45 709/226 |
| 2004/0221088 | A1* | 11/2004 | Lisitsa | H04L 29/06027 710/316 |
| 2004/0221288 | A1* | 11/2004 | Lisitsa | G06F 8/45 718/100 |
| 2005/0022193 | A1* | 1/2005 | Lisitsa | G06F 8/45 718/100 |
| 2005/0219075 | A1* | 10/2005 | Storer | H03M 7/30 341/51 |
| 2006/0143421 | A1* | 6/2006 | Subramoney | G06F 11/348 711/170 |
| 2006/0212672 | A1* | 9/2006 | Chandrasekaran | G06F 3/0608 711/171 |
| 2007/0083571 | A1* | 4/2007 | Meller | G06F 8/654 |
| 2007/0229900 | A1* | 10/2007 | Guarnieri | G06K 15/02 358/1.17 |
| 2007/0236733 | A1* | 10/2007 | Guarnieri | G06K 15/02 358/1.16 |
| 2010/0161567 | A1 | 6/2010 | Makela | |
| 2012/0194361 | A1 | 8/2012 | Archbold et al. | |
| 2014/0184601 | A1* | 7/2014 | Dunaisky | G09G 5/393 345/424 |

OTHER PUBLICATIONS

Anonymous. A Way to Compare Against an Array's Output Data Earlier by Comparing Against the Array's Read Address. [online]Feb. 5, 2013. Retrieved from the Internet: http://ip.com/IPCOM/000225279D, 7 pages.

Jiang. S. et al.; "S-FTL: An Efficient Address Translation for Flash Memory by Exploiting Spatial Locality"; Proceedings of the 2011 IEEE 27th Symposium on Mass Storage Systems and Technologies (May 23-27, 2011), 12 pages.

* cited by examiner

IN-PLACE DATA COMPRESSION WITH SMALL WORKING MEMORY

BACKGROUND

Technical Field

The present disclosure generally relates to data compression.

Description of the Related Art

In-place data compression is a technique in which data stored in a particular memory page is compressed and written back to the same memory page. In other words, the source page of the source data and the target page of the compressed data are the same and there is no need for allocating an additional page as the target page.

SUMMARY

Some embodiments of the disclosure provide a system for performing in-place compression. The in-place compression system compresses source data stored in a memory partition of a memory by retrieving the source data from the memory partition based on a read address and storing the retrieved source data temporarily at a data buffer. The system creates compressed data by referencing the source data stored in the data buffer. The system writes the compressed data to the memory partition based on a write address. When the write address is pointing at an address location storing source data that has not been transferred to the data buffer, the system aborts the compression operation by overwriting the compressed data stored in the memory partition with the source data stored in the data buffer.

In some embodiments, a compression header may be generated prior to retrieving data from the memory partition. The compression header is stored in an overflow buffer and later transferred from the overflow buffer to the memory partition when enough source data has been transferred to the data buffer from the memory partition. In some embodiments, the in-place compression system writes the compressed data into the overflow buffer and not the memory partition when the write address is equal to the read address. The in-place compression system transfers the data stored in the overflow buffer to the memory partition when the write address pointer lags behind the read address pointer. In some embodiments, the in-place compression system overwrites the compressed data stored in the memory partition with the data stored in the data buffer when, upon completion of producing the compressed data, a compression ratio between a size of the compressed data and a size of the source data of the memory partition is more than a threshold ratio.

The preceding Summary is intended to serve as a brief introduction to some embodiments of the disclosure. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a Summary, Detailed Description and the Drawings are provided. Moreover, the claimed subject matter is not to be limited by the illustrative details in the Summary, Detailed Description, and the Drawings, but rather is to be defined by the appended claims, because the claimed subject matter can be embodied in other specific forms without departing from the spirit of the subject matter.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

State of the art compression and decompression hardware uses distinct source and target buffers in memory. For compression, a source page stores the source data and target page stores the compressed data. The reverse is true for decompression. In some system applications, the system software attempts to compress its way out of a low memory condition when the system memory is overcommitted. However, since the system has very little or no free memory, allocating an additional page as a target page may be impossible.

In-place data compression is a technique in which data of a particular page is compressed and written back to the same particular page. In other words, the source page of the source data and the target page of the compressed data are the same and there is no need for allocating an additional page as the target page.

Some embodiments of the disclosure provide a system for performing in-place compression using a small working memory, specifically a small amount of free memory as data buffer and overflow buffer. When compressing source data occupying a page of a memory (or more generally a partition of the memory), the in-place compression system transfers source data from the memory page to a data buffer based on a read address (by retrieving source data from the memory page based on the read address and stores the retrieved source data temporarily at a data buffer). The system creates compressed data by referencing the source data stored in the data buffer and writes the compressed data back to the same memory page based on a write address. When there is insufficient amount of free space in the memory page to store the compressed data, the system aborts the compression operation and restores the source data to the memory page by overwriting the compressed data stored in the page with the source data stored in the data buffer.

Figure 1:
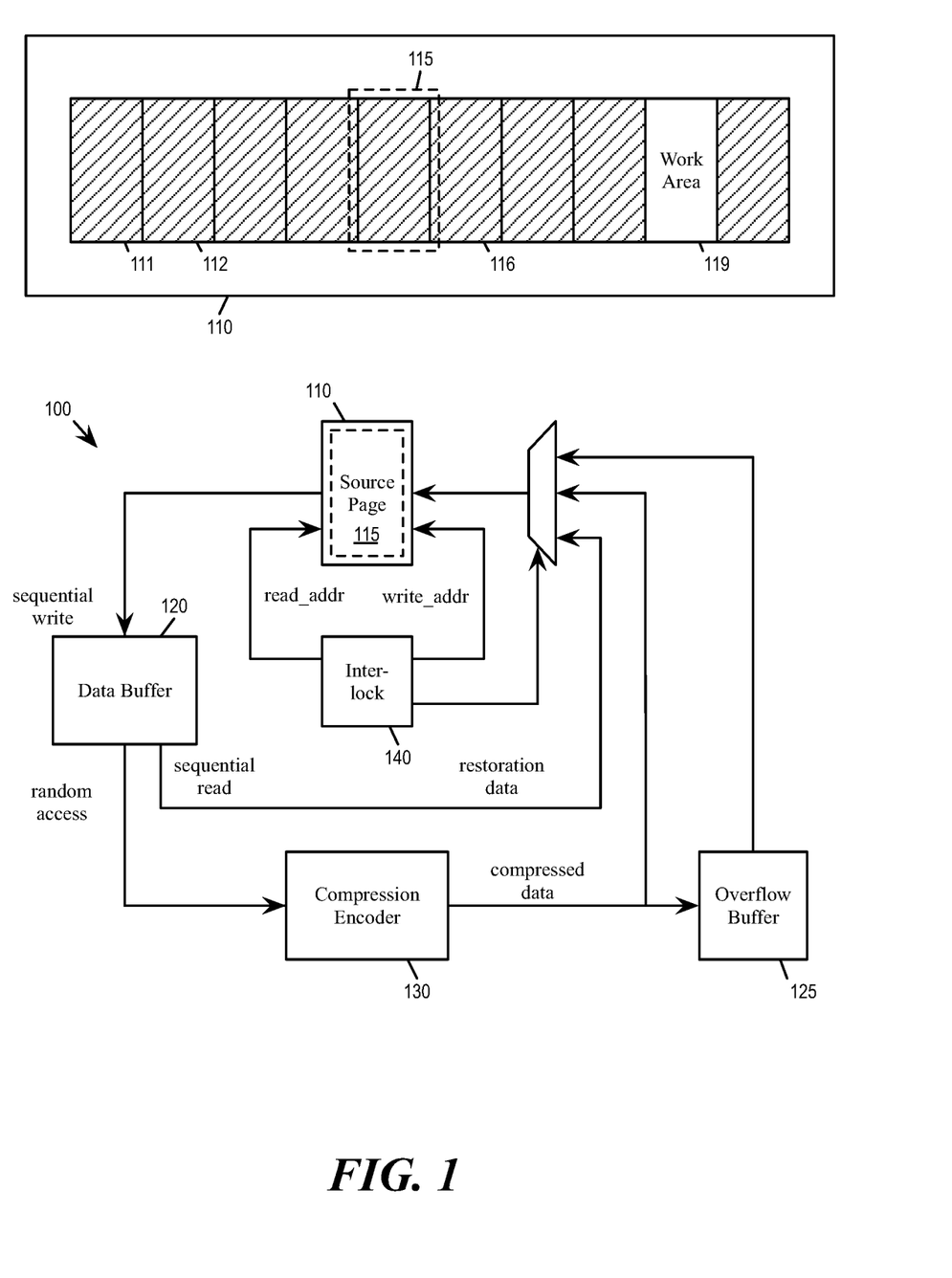
FIG. 1 illustrates the components of an in-place compression system in accordance with an exemplary embodiment.

FIG. 1 illustrates the components of an in-place compression system 100 in accordance with an exemplary embodiment. The in-place compression system 100 is compressing data stored in a memory system 110 of a computing device. The memory system is divided into pages 111-119. In some embodiments, the memory pages are physical partitions of the memory system (such as the pages of a dynamic random access memory). The memory pages may also be software partitions defined by the in-place compression system. As illustrated, most pages of the memory system 110 are already occupied or allocated (illustrated as shaded). One of the pages of the memory is free and is used by the in-place compression system as a working area 119. The in-place compression system 100 is working to compress the data in a memory page 115 (hereafter referred to as the source page).

As illustrated, the in-place compression system 100 includes several components: a data buffer 120, an overflow buffer 125, a compression encoder 130, and an interlock 140. In some embodiments, the modules 120-140 are modules of software instructions being executed by one or more processing units (e.g., a processor) of the computing device. In some embodiments, the modules 120-140 are modules of hardware circuits implemented by one or more integrated circuits (ICs) of an electronic apparatus. Though the modules 120, 125, 130, and 140 are illustrated as being separate modules, some of the modules can be combined into a single module. For example, the functionalities of the interlock 140 can be merged with the compression encoder 130.

The interlock 140 provides the read address for reading data from the memory system 110 as well as the write address for writing data into the memory system. The read address sequentially increments to allow the source data of the source page 115 to be sequentially read out and transferred to the data buffer 120. The data buffer 120 operates as a first-in-first-out (FIFO) buffer when storing incoming source data from the source page 115. The compression encoder 130 performs compression encoding by referencing the source data stored in the data buffer in a random access manner to create compressed data. The compression encoding can be any one of the compression algorithms, such as Lempel-Ziv or ZLib. The created compressed data can be stored at the overflow buffer 125 or written into the source page 115.

In some embodiment, the storage of the overflow buffer 125 and the data buffer 120 reside in a free area of the memory 110, e.g., the working area page 119. In some embodiments, the overflow buffer 125 may reside in a different memory structure than the memory system 110, such as a separate register file. In some embodiments, the data buffer is equal to or greater than the source page in size in order to store the necessary data for restoring the source page. In some embodiments, a memory page is 32K bytes, and the data buffer capacity is also 32K bytes. Some embodiments use larger memory page and data buffer capacity, such as 64K bytes. The overflow buffer can be significantly smaller than the source page/data buffer, e.g., less than 300 bytes. In some embodiments, the size of the overflow buffer is chosen based on the size of one compression header generated by the compression algorithm. The size of the overflow buffer may also be chosen based on a percentage of the size of a memory page, e.g., less than 1%.

The interlock 140 decides which data is written into the source page 115 based on the relative positions of the read and write addresses. Specifically, when the read address is well ahead of the write address (indicating the source page can accept additional compress data without overwriting source data that have not been retrieved and transferred to the data buffer 120), the interlock allows the compressed data from the compression encoder 130 to be directly written into source page 115. When the write address catches up to the read address, (indicating that the source page cannot take in any additional compress data without overwriting source data that have not been retrieved and transferred to the data buffer 120) the interlock may abort the compression operation and restore the source page by copying the source data stored in the data buffer 120 back into the source page 115. The interlock 140 may also let the compressed data fill the overflow buffer 125 first before deciding whether to abort while giving the read address a chance to advance sufficiently. Once the overflow buffer 125 is filled, the interlock 140 may write the content of the overflow buffer into the source page 115 if there is sufficient room. The interlock 140 may also abort and restore the source page with the content of the data buffer 120 if the relative positions of the read and write addresses indicate that there is insufficient room to store the compressed data from the overflow buffer 125.

The interlocking mechanism 140 determines whether to abort the compression operation by examining the read and write address pointers to determine whether there is sufficient amount of free space in the memory page to store the compressed data. In some embodiments, the interlocking mechanism decides to abort when the write address is pointing at an address location that is storing source data that has not been transferred to the data buffer. In some embodiments, the interlocking mechanism decides to abort when the write address has caught up to (i.e., is the same as) the read address. The interlocking mechanism may also decides to abort when the write address has caught up to the read address and the overflow buffer 125 is full.

Figure 2:
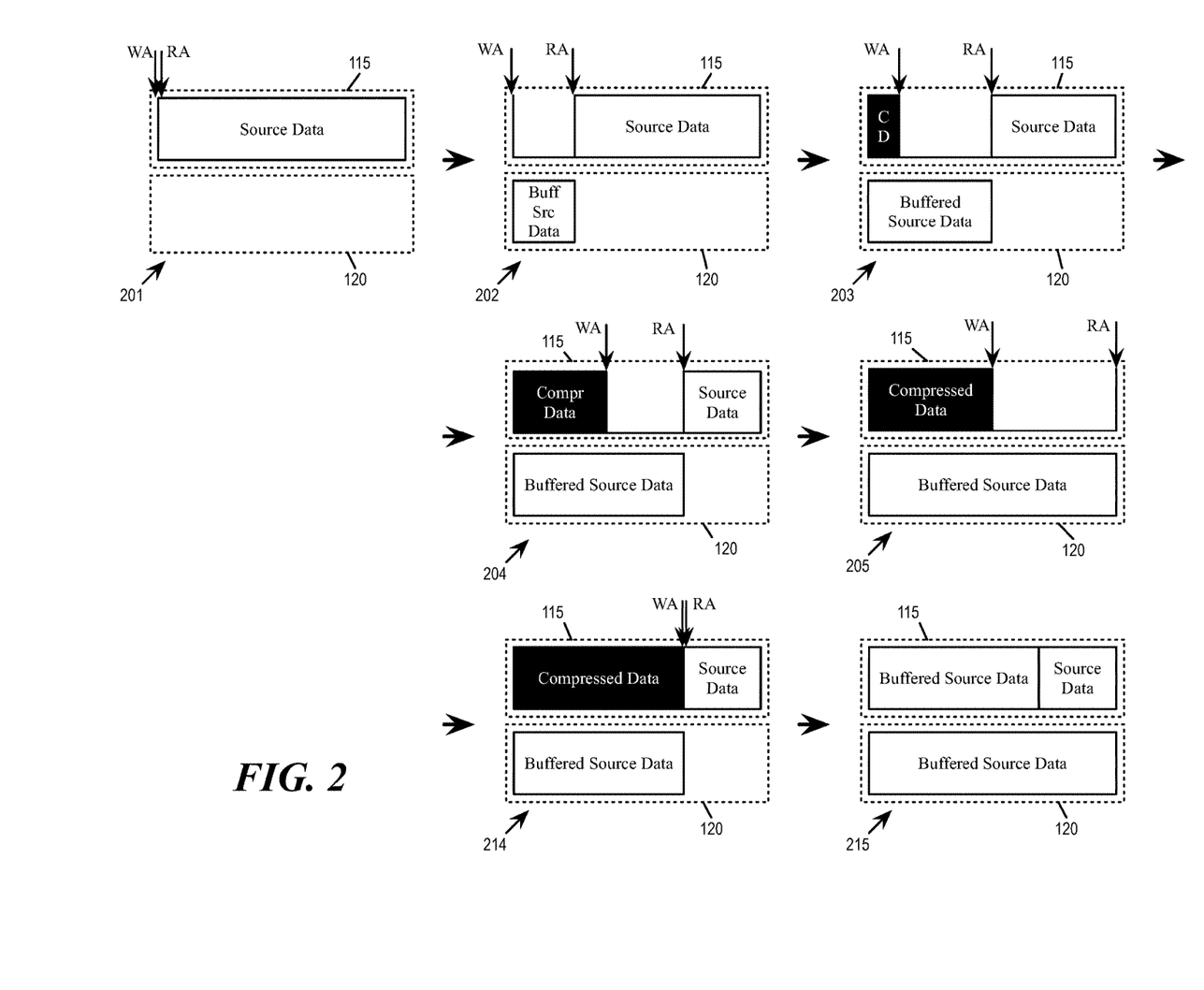
FIG. 2 illustrates example in-place compression operations performed by the in-place compression system.

FIG. 2 illustrates example in-place compression operations performed by the in-place compression system 100. Specifically, the figure illustrates a completed in-place compression operation and an aborted in-place compression operation. The figure illustrates the completed in-place compression operation in five stages 201-205. Each stage conceptually illustrates the content of the source page 115 and the data buffer 120, as well as the state of the read and write addresses to the source page 115.

The first stage 201 shows the initial condition of the in-place compression operation. As illustrated, the source page 115 is filled with source data. None of the source data has been transferred to the data buffer 120. Both the read and write address pointers (RA and WA respectively) are at the start of the source page.

At the second stage 202, the in-place compression system has retrieved a part of the source data from the source page to the data buffer 120 as buffered source data. The transfer of the source data to the data buffer 120 has created room in the source page to accept compressed data. The retrieval of the source data from the source page advances the read address. The compression encoder 130 has not produced any compressed data at this stage, so the write address remains at the beginning of the source page. The lead of the read address over the write address indicates to the interlock 140 that the source page has room to accept compressed data.

At the third stage 203, the compression encoder 130 has started producing compressed data based on the buffered source data in the data buffer 120. Since the read pointer is ahead of the write pointer, the source page has room to accept the compressed data. As the in-place compression system writes the compressed data into the source page 115, the write pointer advances.

At the fourth stage 204, the system continues to transfer uncompressed source data into the data buffer 120, the compression encoder 130 continues to produce compressed data, and the system continues to write the compressed data into the source page and advances the write address. In this example, the compressed data takes up less space than the source data it replaces, so the write address remain safely behind the read address, indicating there is room to accept more compressed data.

At the fifth stage 205, the compression encoder 140 has finished producing the compressed version of the source data. All of the compressed data are successfully written into the source page, and all of the source data is read and transferred to the data buffer 120. In other words, the in-place compression has completely replaced the source data stored in the source page with its compressed version. Though not illustrated, the buffered source data in the data buffer 120 would be discarded, and the data buffer 120 would become available for in-place compression of another page (or partition) of the memory system 110 by buffering the source data of that page.

Stages 201-205 illustrate a successful in-place compression operation because the source data in the source page can be compressed to produce a compressed version of the source data that occupies less space than the source data. However, there are source data that cannot be compressed, i.e., its compressed version may be larger in size than the source data. In these instances, the source page would not have enough room to store the generated compressed data and the write address would catch up to the read address. The in-place compression system would then abort the compression operation and restore the source page with buffered source data stored in the data buffer 120. FIG. 2 illustrates an aborted in-place compression operations in five stages 201-203 and 214-215.

The stages 201-203 show the beginning stages of an in-place compression operation as described above. At the stage 214, the compression encoder generates so much compressed data that the write address pointer catches the read address pointer. This is indicative that the source data cannot be efficiently compressed and that the compressed data may exceed the source data in size. Thus, instead of allowing the compressed data to write over source data that have not been copied to the data buffer (i.e., so the write pointer overtakes read pointer), the interlock 140 aborts the in-place compression of the source page and restores the source data by copying the source data buffered at the data buffer 120 back to the source page.

The stage 215 shows the content of the source page 115 after in-place compression is aborted and the source data restored to the source page. As illustrated, the compressed data in the source page is overwritten. The source page is now filled with the source data that was buffered in the source buffer, along with source data that was never retrieved and transferred to the data buffer.

In some embodiments, the compression encoder 130 uses a compression algorithm that generates a header prior to transferring data from the source page. In other words, the compression encoder generates data that needs to be written into source page before enough source data has been transferred to the data buffer to make room for the generated data. The in-place compression system in these instances stores the generated header at an overflow buffer (also referred to as a header buffer) and transfers the header from the overflow buffer to the source page after enough source data has been transferred to the data buffer to make room in the source page.

Figure 3:
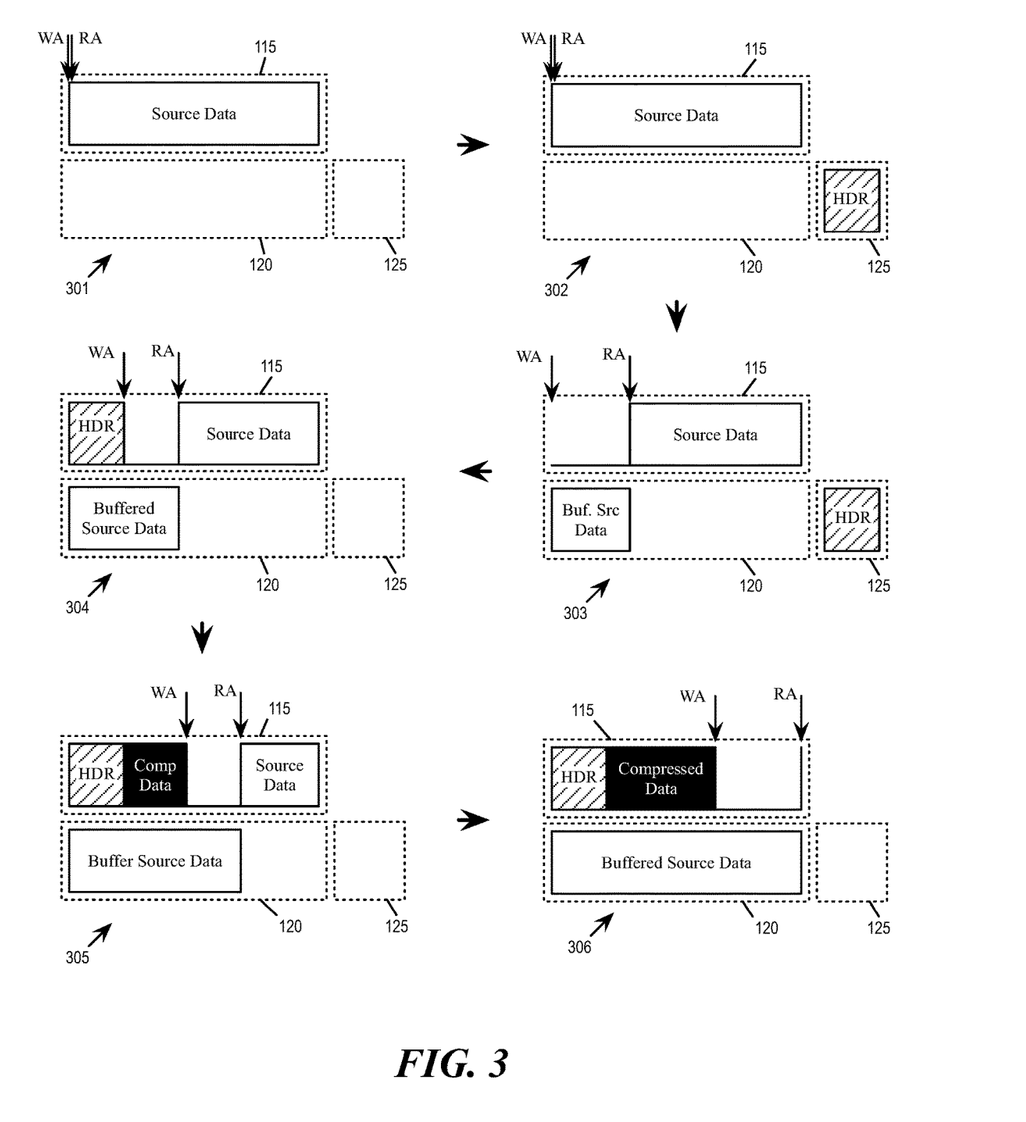
FIG. 3 illustrates example in-place compression operations performed by the in-place compression system when the compression encoder generates a header.

FIG. 3 illustrates example in-place compression operations performed by the in-place compression system 100 when the compression encoder generates a header. The generated header is staged at the overflow buffer 125 until enough source data has been transferred out of the source page to make room for the generated header. The figure illustrates the completed in-place compression operation in six stages 301-306. Each stage conceptually illustrates the content of the source page 115, the data buffer 120, the overflow buffer 125, as well as the state of the read and write addresses to the source page.

The first stage 301 shows the initial condition of the in-place compression operation. As illustrated, the source page 115 is filled with source data. None of the source data has been transferred to the data buffer 120. Both the read and write address pointer (RA and WA respectively) are at the start of the source page. The overflow buffer 125 is also empty.

At the second stage 302, the compression encoder 130 has generated a header (HDR) for the compressed data, but before compression system has transferred any data from the source page 115 to the data buffer 120. In other words, there is no room in the source page for the generated header, as indicated by the fact that the read address is still at the beginning of the source page. Instead of overwriting source data in the source page, the in-place compression system stores the generated header in the overflow buffer 125.

At the third stage 303, the in-place compression system has retrieved a part of the source data from the source page to the data buffer 120 as buffered source data. The compression system transfers data from the source page to the data buffer (and advances the read address pointer), and the interlock 140 in turn uses the lead of the read address over the write address to determine whether the source page has enough room to accept the header and perhaps some compressed data.

At the fourth stage 304, the transfer of the source data to the data buffer 120 has created room in the source page to accept the generated header and some compressed data. The interlock 140 of the compression system makes this determination based on the relative positions of the write and read addresses (e.g., the size of the lead of the read address over the write address.) The compression system in turn transfers the generated header data from the overflow buffer 125 into the source page 115.

At the fifth stage 305, the compression encoder 130 has produced compressed data based on the buffered source data in the data buffer 120, while the read address continues to advance as source data are transferred to the data buffer 120. Since the read pointer is ahead of the write pointer, the source page has room to accept the compressed data. The compressed data is written into the source page following the compression header (HDR).

At the sixth stage 306, the compression encoder 140 has finished producing the compressed version of the source data. All of the compressed data are successfully written into the source page following the compression header, and all of the source data is read and transferred to the data buffer 120. Though not illustrated, in view of the concepts embodied herein, the in-place compression system may abort the in-place compression operation (and restore the source data from the data buffer 120) if the relative positions of the read and write addresses indicate that there isn't enough room to store the compressed data in the source page.

More generally, the compression encoder may in the short term generate more data to be written into the source page than there is room in the source page for storing the generated data, while later encountering highly compressible data patterns in the source data to create enough room in the source page to store all the compressed data. (An example of this scenario is when the compression encoder generates a compression header without retrieving any source data as described above.)

In these instances, the in-place compression system uses the overflow buffer to temporarily absorb the excess data generated by the compression encoder 130. This allows the compression operation a chance to arrive at the more compressible data later in the data pattern and create enough room in the source page to store the compressed data. Specifically, in some embodiments, if the write address has caught up with read address and the compression encoder has generated additional data to be written (header or compressed data) into the source page, the additional data is written into the overflow buffer until the read address has moved sufficiently ahead of the write address.

Figure 4:
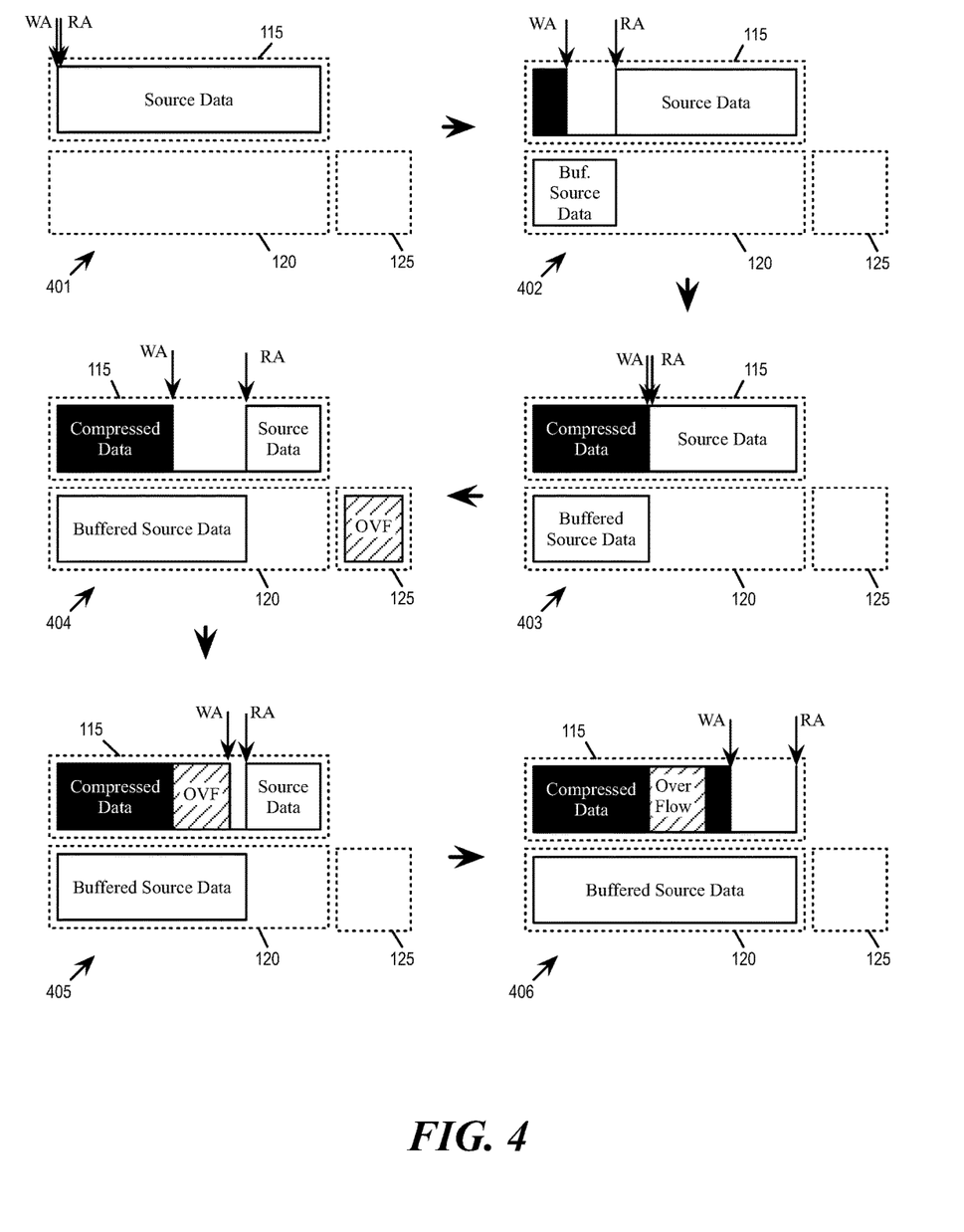
FIG. 4 illustrates example in-place compression operations performed by the in-place compression system that use the overflow buffer to temporarily absorb excess data generated by the comparison encoder.

FIG. 4 illustrates example in-place compression operations performed by the in-place compression system 100 that use the overflow buffer 125 to temporarily absorb excess data generated by the comparison encoder 130. The overflow buffer 125 temporarily stores the excess compressed data to permit the compression operation to create enough room in the source page to store the compressed data. The figure illustrates the completed in-place compression operation in six stages 401-406. Each stage conceptually illustrates the content of the source page 115, the data buffer 120, the overflow buffer 125, as well as the state of the read and write addresses to the source page.

The first stage 401 shows the initial condition of the in-place compression operation. As illustrated, the source page 115 is filled with source data. None of the source data has been retrieved and transferred to the data buffer 120. Both the read and write address pointers (RA and WA respectively) are at the start of the source page. The overflow buffer 125 is also empty.

At the second stage 402, the compression encoder 130 has started producing compressed data by referencing the buffered source data in the data buffer 120. The system writes the compressed data into the source page as long as the write address is behind the read address to indicate that the source page has room to accept the compressed data.

At the third stage 403, the write address has caught up to the read address, indicating that the source page does not have room to store additional compressed data. However, the compression encoder continues to generate compressed data. The compression system in turn directs the excess compressed data to be stored at the overflow buffer 125 rather than the source page. When the excess compressed data is being written to the overflow buffer, the write address does not advance. This gives the compression system an opportunity to transfer additional source data out of the source page and to explore whether enough room in the source page would be created with more compressible data later in the source page.

At the fourth stage 404, the read address has opened up a lead over the write address while the overflow buffer 125 absorbs the excess compressed data ("OVF"). This lead of the read address over the write address indicates to the interlock 140 that the source page has enough room to store further compressed data, including the excess data buffered at the overflow buffer 125.

The fifth stage 405 shows the compression system having transferred the excess data ("OVF") from the overflow buffer 125 to the source page 120.

At the sixth stage 406, the compression encoder 140 has finished producing the compressed version of the source data. All of the source data is read and transferred to the data buffer 120. All of the compressed data have been successfully written into the source page, including the excess data ("OVF") and the compressed data that are generated after the excess data.

Though not illustrated, it is possible that the overflow buffer may not have enough room to temporarily hold the excess compressed data, or that the source data cannot be efficiently compressed to fit within the source page, even with excess compressed data buffered at the overflow buffer 125. In these instances, the write pointer would eventually catch up with the read pointer, and the interlock mechanism 140 would abort the in-place compression operation and restore the source data from the data buffer 120 to the source page 115.

In some embodiments, even if the compressed data can successfully fit in the source page, the in-place compression system may decide that it is not cost effective to store the source data in its compressed form and restore the source data stored in the data buffer back to the source page anyways. Specifically, in some embodiments, when the size of the compressed version of the source data is not smaller than the original source data by at least a specified threshold ratio, the compression system would undo the compression and restore the source data to the source page. In some embodiments, the system would keep the compressed data and not restore the source data only if condition RSIZE*CRATIO<WSIZE is met. RSIZE is the size of the source data (determined based on the read address pointer at the completion of compression); WSIZE is the size of the compressed data (determined based on the write address pointer at the completion of compression); and CRATIO is a threshold compression ratio (between 0 and 1) set by the user. In some embodiments, CRATIO is set to be 0.6. In other words, only compressed data that is less than 60% of the size of the original source data would be kept by the in-place compression system.

Figure 5A:
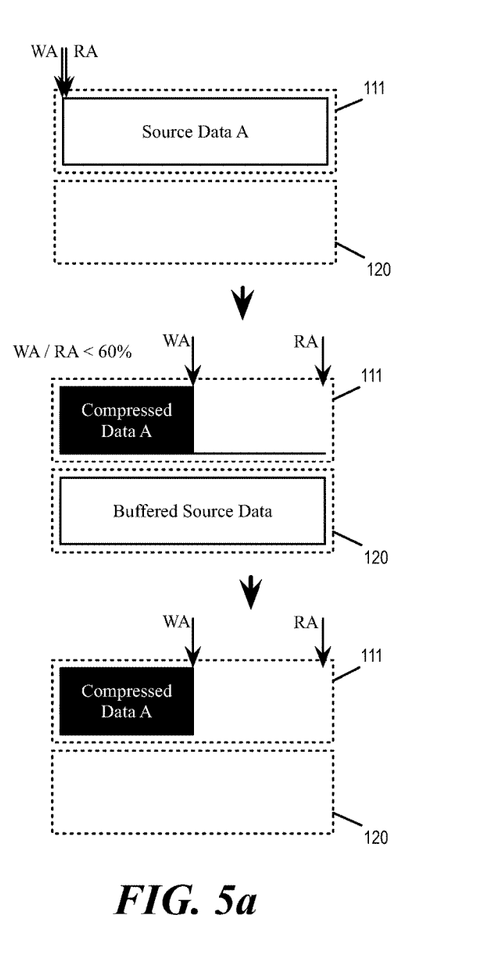
FIGS. 5a-b illustrate using compression ratio to determine whether to keep compressed data or to restore the source data from the data buffer.
Figure 5B:
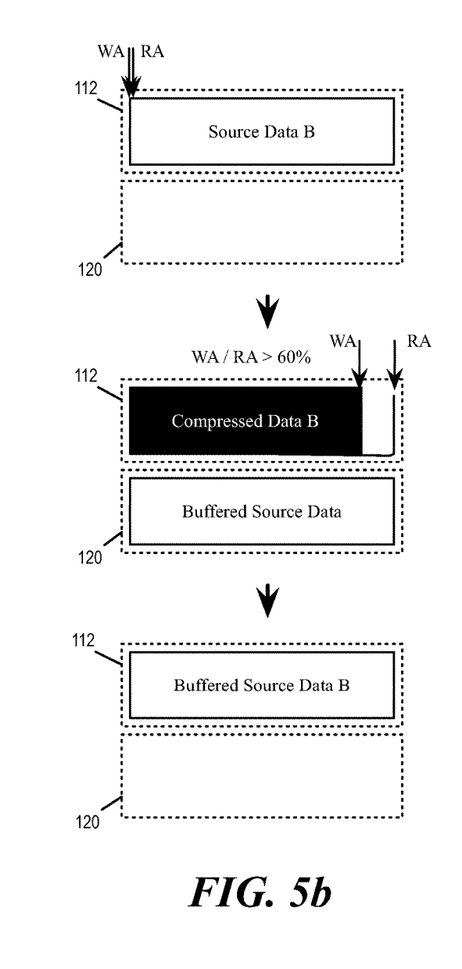

FIG. 5a-b illustrates using compression ratio to determine whether to keep compressed data or to restore the source data from the data buffer. The compression ratio is computed based on the read and write address pointers upon completion of the compression operation.

FIG. 5a illustrates an in-place compression operation whose compression ratio is less than CRATIO of 60%. As illustrated, the compression operation compresses source data A in a source page 111 into compressed data A. Since the compression ratio satisfies the specified CRATIO requirement, the compression system keeps the compressed data and discards the source data buffered in the data buffer. FIG. 5b illustrates another in-place compression operation whose compression ratio is more than CRATIO of 60%. As illustrated, the compression operation compresses source data B in a source page 112 into compressed data B. Since the compression ratio fails the specified requirement, the compression system restores the source data from the data buffer 120 back to the source page 112.

Figure 6A:
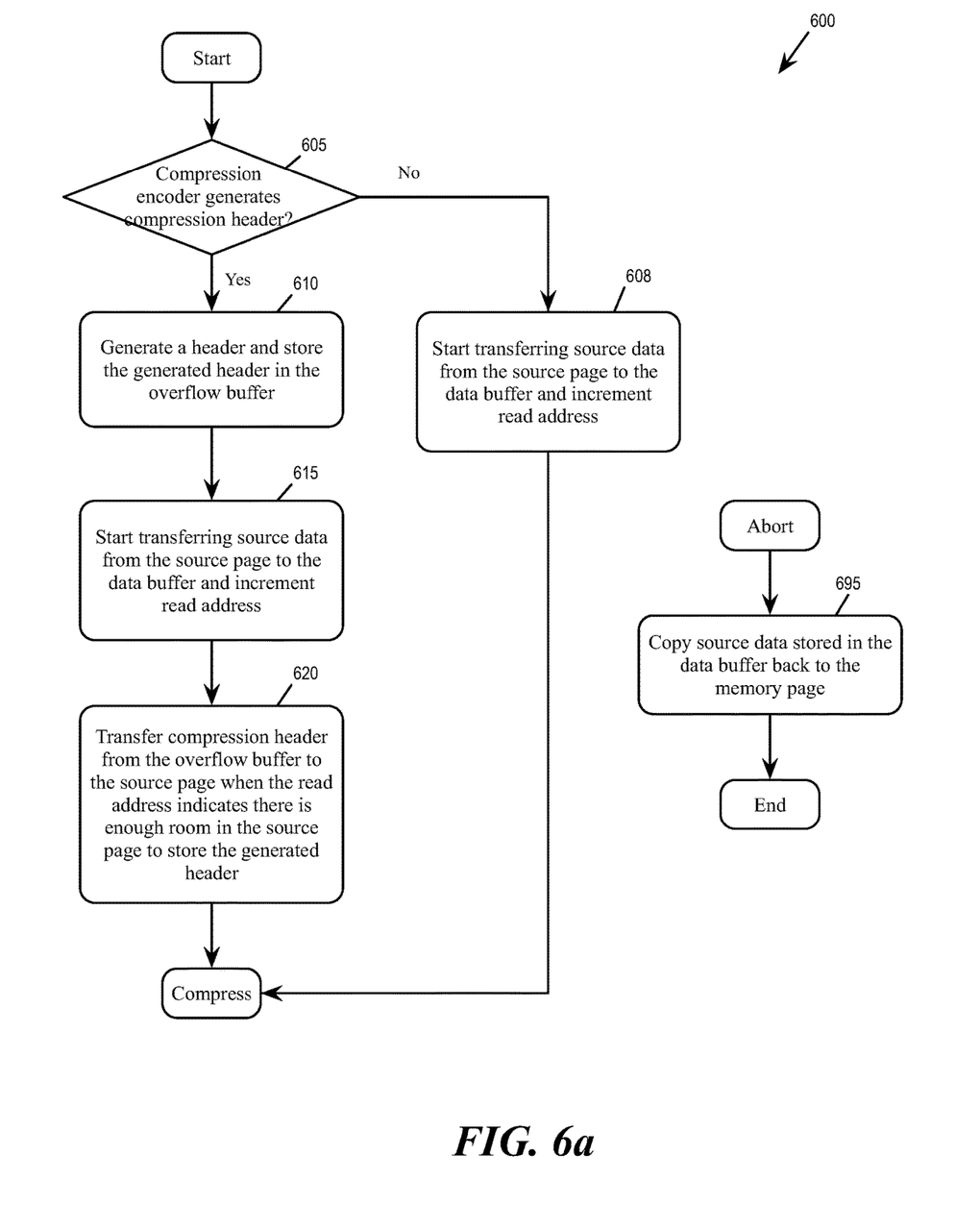
FIGS. 6a-b conceptually illustrates a process for performing in-place compression, consistent with an exemplary embodiment.
Figure 6B:
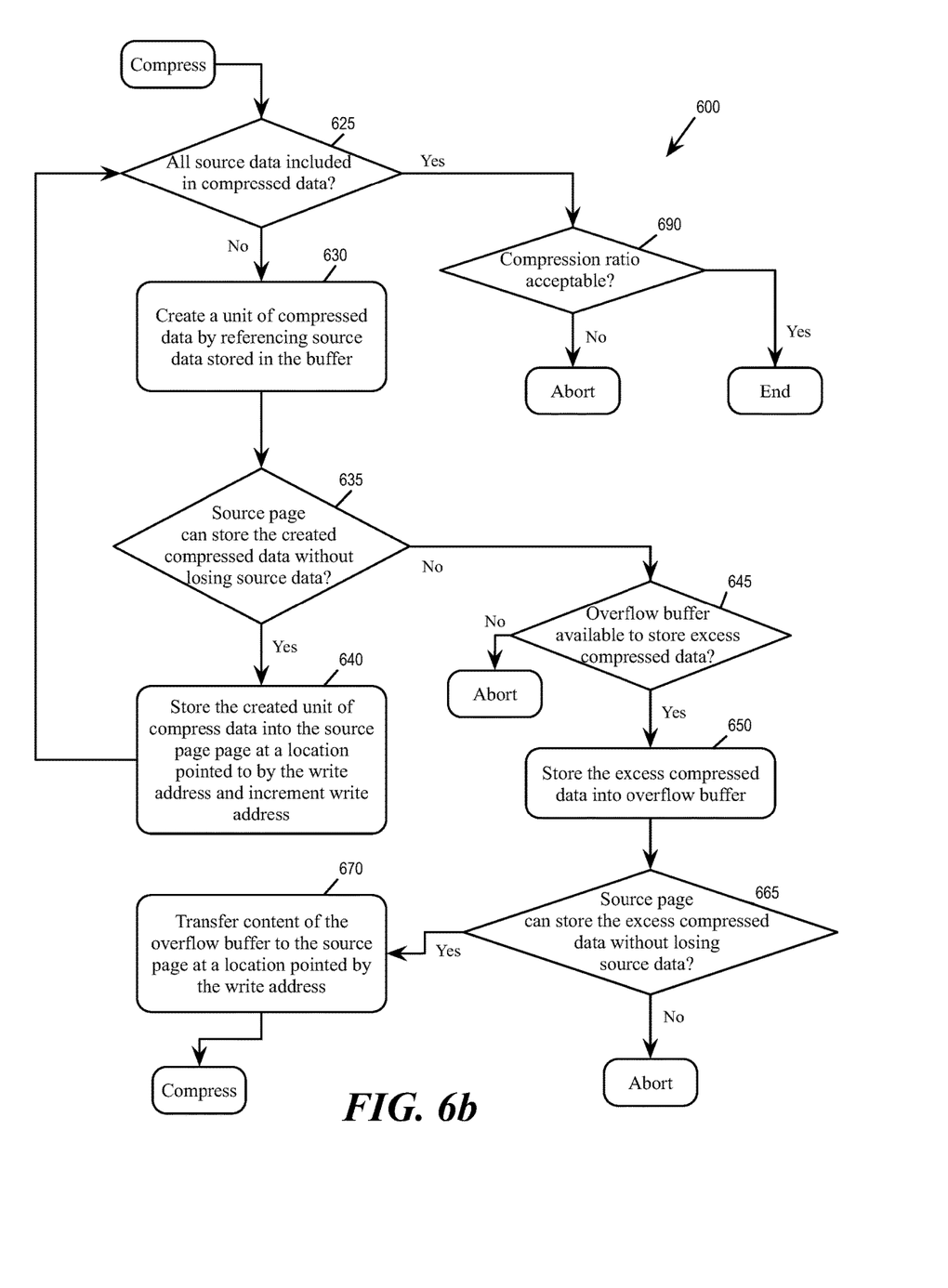

FIGS. 6*a-b* conceptually illustrate a process 600 for performing in-place compression, consistent with an exemplary embodiment. In some embodiments, one or more processing units (e.g., processor) of a computing device implementing the in-place compression system 100 perform the process 600 when compressing data stored in a page (or a partition) of a memory system. The examples illustrated in FIG. 2-5 are based on the process 600 in some embodiments.

The in-place compression system starts the process 600 when it determines (at 610) whether the compression-encoding algorithm employed by the compression encoder generates a compression header. If so, the process proceeds to 610. If the compression-encoding algorithm does not generate compression header, the process proceeds to 608.

At 608, the in-place compression system starts transferring source data from the source page to the data buffer and increments the read address. Each unit (e.g., byte or word) of source data is retrieved from the source page according to the read address. The process also proceeds to 625 (labeled "compress" in the figure).

At 610, the in-place compression system generates (by using the compression encoder) the compression header and stores the generated header in the overflow buffer (125). The process then starts (at 615) transferring source data from the source page to the data buffer and increments the read address. When read address indicates that there is enough room in the source page to store the generated header (based on separation between the read address and the write address), the process transfers (at 620) the compression header from the overflow buffer to the source page. By transferring the header data from the overflow buffer to the source page, the overflow buffer becomes available to store excess compression data later. The process then proceeds to 625 (labeled "compress" in the figure). The buffering of compression header in the overflow buffer is described by reference to FIG. 3 above At 625, the in-place compression system determines (at 625) whether all source data of the page are compressed, i.e., encoded into the compressed data. If there are source data in the data buffer that yet to be encoded and included in the compressed data (i.e., there are still source data yet to be compressed), the process proceeds to 630. If all of the source data in the buffer have been processed and encoded into the compressed data (i.e., al source data have been compressed), the process proceeds to 690.

At 630, the in-place compression system creates a unit of compressed data by referencing the source data stored in the data buffer. The compressed data is created according to a compression encoding algorithm (e.g., LZ or Zlib).

The in-place compression system then determines (at 635) whether the source page can store the created compressed data without losing source data. When the source page cannot store the created compressed data without losing source data (by overwriting), the excess compress data either has to be stored elsewhere (e.g., the overflow buffer) or the compression operation has to be aborted. The system examines whether the write address is pointing at a location storing data that has not been read and transferred to data buffer, or whether the write address has caught up with the read address. If the write address has caught the read address (i.e., there is no room in the source page), the process proceeds to 645. If the write address has not caught the read address (i.e., there is room in the source page), the process proceeds to 640.

At 640, the in-place compression system stores the created unit of the compressed data into the source page at a location pointed to by the write address. The write address is also incremented. The process then returns to 625 to further create compressed data from the source data.

At 645, the in-place compression system determines whether the overflow buffer is available to store the excess compressed data, i.e., the compressed data that cannot be presently stored into the source page without overwriting source data. If the overflow buffer is available for storing (e.g., empty) the excess data, the process proceeds to 650. If the overflow buffer is already filled with data and cannot store the excess compressed data, the process proceeds to 695 (labeled "abort").

At 650, the in-place compression system stores the excess compressed data into the overflow buffer. The in-place compression system then determines (at 665) whether the source page can store the excess compressed data in the overflow buffer without losing source data. The compression system examines the read and write addresses of the source page to determine whether the read pointer is sufficiently ahead of the write pointer. If the read address is sufficiently ahead of write address (i.e., there is enough room in the source page for the excess data in the overflow buffer), the process proceeds to 670. If read address is not sufficiently ahead of write address (i.e., there is no room in the source page for the excess data in the overflow buffer), the process proceeds to 695 (labeled "abort").

At 670, the in-place compression system transfers the content of the overflow buffer to the source page at a location pointed to by the write address. The process then proceeds to 625 (labeled "compress").

At 690, the in-place compression system determines whether the compression ratio is acceptable, after having finished compressing the source data in the source page. The system compares size of the source data (based on the read address) with the size of the compressed data (based on the write address) of the source page. If the compression ratio is acceptable (e.g., smaller than CRATIO), the process 600 ends. If the compression ratio is not acceptable (e.g., larger than or equal to CRATIO), the process proceeds to 695 (labeled "abort").

At 695, the in-place compression system copies the source data stored in the data buffer back to the memory page. This effectively aborts the compression operation and restores the source page to its original source data. The process 600 then ends.

In some embodiments, the components of the in-place compression system are also used for decompression. In these instances, the source page (e.g., 115) is occupied by compressed data, and the data buffer 120 is used to store the decompressed source data. When the source data of the page is completely decompressed, the system transfers the decompressed source data from the data buffer 120 back to the source page (and overwrite the compressed data). It is worth noting that the decompressed data would always take up more space than the compressed data, it is therefore necessary to store the decompressed data in the data buffer 120 first.

Figure 7:
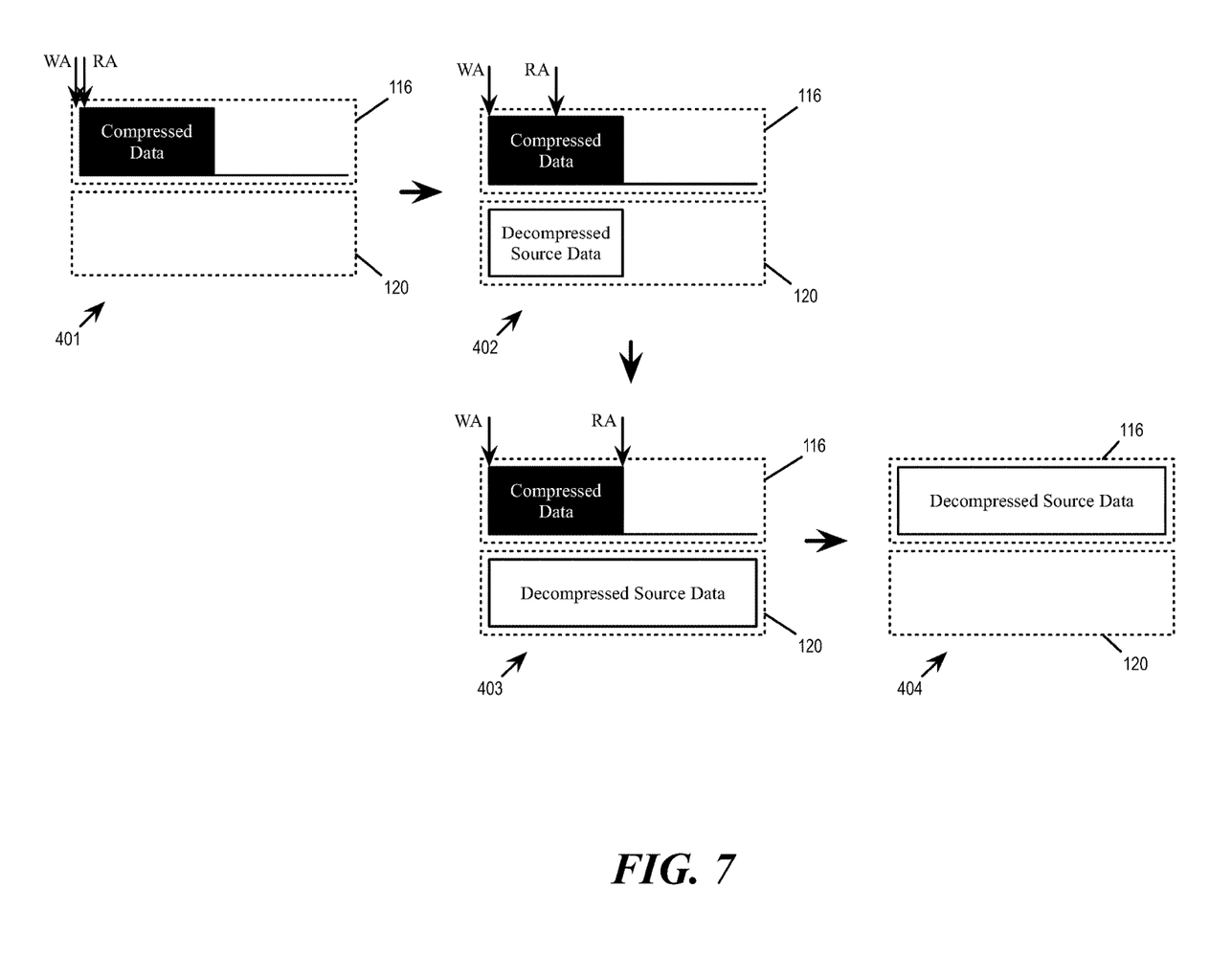
FIG. 7 illustrates an example decompression operation performed by the in-place compression system.

FIG. 7 illustrates an example decompression operation performed by the in-place compression system. The decompression operation decompresses a set of compressed data stored in a page (or partition) 116 of the memory system 110. The decompressed data is buffered at in the data buffer 120 during the decompression operation. The figure shows the decompression operation in four stages 701-704. Each stage conceptually illustrates the content of the source page 115, the data buffer 120, as well as the state of the read and write addresses to the source page.

The first stage 701 shows the source page 116 initially loaded with compressed data. The data buffer is empty and available for temporality storing the decompressed source data generated by the decompression operation.

The second stage 702 shows in-place compression system processing (reading) the compressed data and producing decompressed source data, which is temporality stored in the data buffer 120.

The third stage 703 shows the in-place compression system has completed processing the compressed data. The decompressed source data now occupies the data buffer.

At the fourth stage 704, the decompressed source data is transferred to the source page 116, overwriting the compressed data.

Example Electronic System

The present application may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks. The flowchart and block diagrams in the Figures (e.g., FIG. 6*a-b*) illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 8:
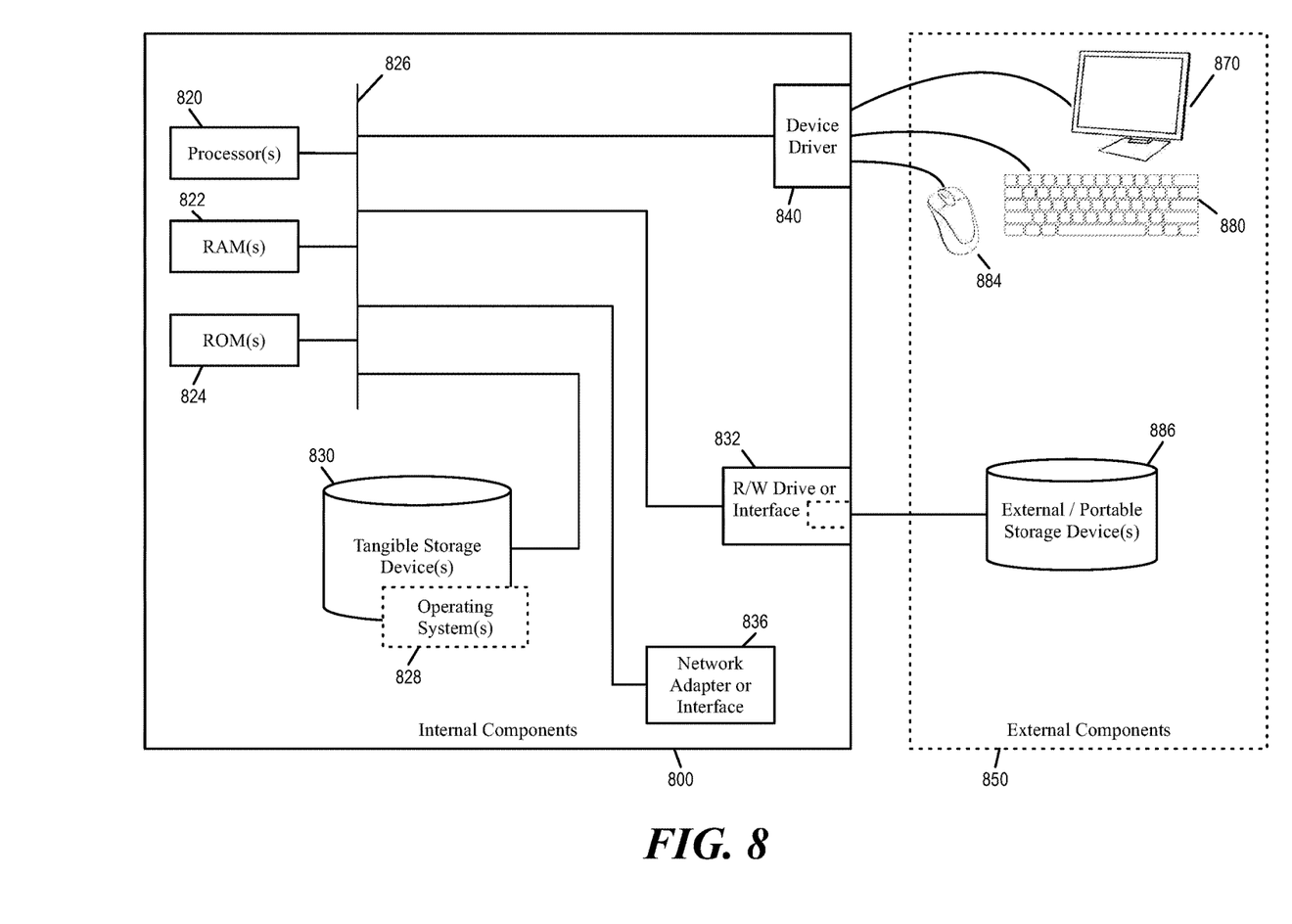
FIG. 8 shows a block diagram of the components of a data processing system in accordance with an illustrative embodiment of the present disclosure.

FIG. 8 shows a block diagram of the components of data processing systems 800 and 850 that may be used to implement a in-place compression system (i.e., the in-place compression system 100) in accordance with an illustrative embodiment of the present disclosure. It should be appreciated that FIG. 8 provides only an illustration of one implementation and does not imply any limitations with regard to the environments in which different embodiments may be implemented. Many modifications to the depicted environments may be made based on design and implementation requirements.

Data processing systems 800 and 850 are representative of any electronic device capable of executing machine-readable program instructions. Data processing systems 800 and 850 may be representative of a smart phone, a computer system, PDA, or other electronic devices. Examples of computing systems, environments, and/or configurations that may represented by data processing systems 800 and 850 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

The data processing systems 800 and 850 may include a set of internal components 800 and a set of external components 850 illustrated in FIG. 8. The set of internal components 800 includes one or more processors 820, one or more computer-readable RAMs 822 and one or more computer-readable ROMs 824 on one or more buses 826, and one or more operating systems 828 and one or more computer-readable tangible storage devices 830. The one or more operating systems 828 and programs such as the programs for executing the process 600 are stored on one or more computer-readable tangible storage devices 830 for execution by one or more processors 820 via one or more RAMs 822 (which typically include cache memory). In the embodiment illustrated in FIG. 8, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory or any other computer-readable tangible storage device that can store a computer program and digital information.

The set of internal components 800 also includes a R/W drive or interface 832 to read from and write to one or more portable computer-readable tangible storage devices 886 such as a CD-ROM, DVD, memory stick, magnetic tape, magnetic disk, optical disk or semiconductor storage device. The instructions for executing the process 600 can be stored on one or more of the respective portable computer-readable tangible storage devices 886, read via the respective R/W drive or interface 832 and loaded into the respective hard drive 830.

The set of internal components 800 may also include network adapters (or switch port cards) or interfaces 836 such as a TCP/IP adapter cards, wireless Wi-Fi interface cards, or 3G or 4G wireless interface cards or other wired or wireless communication links. Instructions of processes or programs described above can be downloaded from an external computer (e.g., server) via a network (for example, the Internet, a local area network or other, wide area network) and respective network adapters or interfaces 836. From the network adapters (or switch port adaptors) or interfaces 836, the instructions and data of the described programs or processes are loaded into the respective hard drive 830. The network may comprise copper wires, optical fibers, wireless transmission, routers, firewalls, switches, gateway computers and/or edge servers.

The set of external components 850 can include a computer display monitor 870, a keyboard 880, and a computer mouse 884. The set of external components 850 can also include touch screens, virtual keyboards, touch pads, pointing devices, and other human interface devices. The set of internal components 800 also includes device drivers 840 to interface to computer display monitor 870, keyboard 880 and computer mouse 884. The device drivers 840, R/W drive or interface 832 and network adapter or interface 836 comprise hardware and software (stored in storage device 830 and/or ROM 824).

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method comprising:
transferring source data from a partition of a memory to a data buffer based on a read address;
creating compressed data by referencing the source data stored in the data buffer;
writing the compressed data to the memory partition based on a write address;
overwriting the compressed data stored in the memory partition with the source data stored in the data buffer when the write address points to an address location that stores source data that has not been transferred to the data buffer.

2. The computer-implemented method of claim 1, wherein the write address points to an address location that stores source data that has not been transferred to the data buffer when the write address and the read address are the same.

3. The computer-implemented method of claim 1, wherein the data buffer is equal in size to the memory partition.

4. The computer-implemented method of claim 1, further comprising:
generating a compression header prior to retrieving data from the memory partition;
storing the compression header in an overflow buffer;

transferring the compression header from the overflow buffer to the memory partition after enough source data has been transferred to the data buffer from the memory partition.

5. The computer-implemented method of claim 4, wherein a size of the overflow is based on a size of a compression header.

6. The computer-implemented method of claim 4, wherein the overflow buffer and the data buffer reside in a free area of the memory.

7. The computer-implemented method of claim 1, wherein writing the compressed data to the memory partition comprises:
    writing the compressed data into the memory partition when the write address lags behind the read address;
    writing the compressed data at an overflow buffer instead of the memory partition when the write address is equal to the read address; and
    transferring the data stored in the overflow buffer to the memory partition when the write address lags behind the read address.

8. The computer-implemented method of claim 1, further comprising overwriting the compressed data stored in the memory partition with the data stored in the data buffer when, upon completion of the compress data into the memory partition, a compression ratio between a size of the compressed data and a size of the source data of the memory partition is more than a threshold ratio.

9. The computer-implemented method of claim 8, wherein the compression ratio is determined based on the read address and the write address.

10. A computing device comprising:
    a set of one or more processing units; and
    a storage device storing a set of instructions, wherein an execution of the set of instructions by the set of processing units configures the computing device to perform acts comprising:
    transferring source data from a partition of a memory to a data buffer based on a read address;
    creating compressed data by referencing the source data stored in the data buffer;
    writing the compressed data to the memory partition based on a write address; and
    overwriting the compressed data stored in the memory partition with the source data stored in the data buffer when the write address points to an address location that stores source data that has not been transferred to the data buffer.

11. The computing device of claim 10, wherein the write address points to an address location that stores source data that has not been transferred to the data buffer when the write address and the read address are the same.

12. The computing device of claim 10, wherein the execution of the set of instructions further configures the computer device to perform acts comprising:
    generating a compression header prior to retrieving data from the memory partition;
    storing the compression header in an overflow buffer;
    transferring the compression header from the overflow buffer to the memory partition after enough source data has been transferred to the data buffer from the memory partition.

13. The computing device of claim 12, wherein the overflow buffer and the data buffer reside in a free area of the memory.

14. The computing device of claim 10, wherein writing the compressed data to the memory partition comprises:
    writing the compressed data into the memory partition when the write address lags behind the read address;
    writing the compressed data at an overflow buffer instead of the memory partition when the write address is equal to the read address; and
    transferring the data stored in the overflow buffer to the memory partition when the write address lags behind the read address.

15. The computing device of claim 14, wherein the overflow buffer is smaller in size than the data buffer.

16. The computing device of claim 10, wherein the execution of the set of instructions further configures the computer device to perform acts comprising overwriting the compressed version of the data stored in the memory partition with the data stored in the data buffer when, upon completion of the compress data into the memory partition, a compression ratio between a size of the compressed data and a size of the source data of the memory partition is more than a threshold ratio, wherein the compression ratio is determined based on the read address and the write address.

17. A computer program product comprising:
    one or more non-transitory computer-readable storage device and program instructions stored on at least one of the one or more non-transitory storage devices, the program instructions executable by a processor, the program instructions comprising sets of instructions for:
    transferring source data from a partition of a memory to a data buffer based on a read address;
    creating compressed data by referencing the source data stored in the data buffer;
    writing the compressed data to the memory partition based on a write address; and
    overwriting the compressed data stored in the memory partition with the source data stored in the data buffer when the write address points at an address location that stores source data that has not been transferred to the data buffer.

18. The computer-implemented method of claim 17, wherein writing the compressed data to the memory partition comprises:
    writing the compressed data into the memory partition when the write address lags behind the read address;
    writing the compressed data at an overflow buffer and not the memory partition when the write address is equal to the read address; and
    transferring the data stored in the overflow buffer to the memory partition when the write address lags behind the read address.

19. The computer-implemented method of claim 18, further comprising:
    generating a compression header prior to retrieving data from the memory partition;
    storing the compression header in an overflow buffer;
    transferring the compression header from the overflow buffer to the memory partition after enough source data has been transferred to the data buffer from the memory partition.

20. The computer-implemented method of claim 17, further comprising overwriting the compressed version of the data stored in the memory partition with the data stored in the data buffer when, upon completion of the compress data into the memory partition, a compression ratio between a size of the compressed data and a size of the source data of the memory partition is more than a threshold ratio, wherein the compression ratio is determined based on the read address and the write address.

* * * * *